United States Patent
Zaitsu et al.

(10) Patent No.: US 10,199,101 B2
(45) Date of Patent: Feb. 5, 2019

(54) METHOD FOR CONTROLLING RESISTIVE MEMORY DEVICE

(71) Applicant: TOSHIBA MEMORY CORPORATION, Tokyo (JP)

(72) Inventors: Koichiro Zaitsu, Yokkaichi Mie (JP); Takayuki Tsukamoto, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/705,226

(22) Filed: Sep. 14, 2017

(65) Prior Publication Data

US 2018/0182455 A1   Jun. 28, 2018

(30) Foreign Application Priority Data

Dec. 28, 2016   (JP) ................. 2016-255009

(51) Int. Cl.
*G11C 11/00*   (2006.01)
*G11C 13/00*   (2006.01)

(52) U.S. Cl.
CPC ........ *G11C 13/0064* (2013.01); *G11C 13/004* (2013.01); *G11C 13/0035* (2013.01); *G11C 13/0069* (2013.01)

(58) Field of Classification Search
CPC . G11C 16/26; G11C 16/0483; G11C 11/5628; G11C 2207/2245; G11C 7/22; G11C 16/04; G11C 29/06; G11C 2029/1202; G11C 29/025; G11C 16/24; G11C 16/3459

USPC ........... 365/185.19, 185.03, 185.18, 185.22, 365/185.11, 185.12, 185.21, 185.29, 229, 365/63, 148, 160, 185.02
See application file for complete search history.

(56) References Cited

U.S. PATENT DOCUMENTS

| | | | |
|---|---|---|---|
| 8,717,801 B2 | 5/2014 | Maejima et al. | |
| 2011/0264842 A1 | 10/2011 | Nakanishi et al. | |
| 2014/0325165 A1 | 10/2014 | Kobayashi et al. | |
| 2017/0243642 A1* | 8/2017 | Muralimanohar | ... G11C 13/004 |

FOREIGN PATENT DOCUMENTS

JP   2014-216041 A   11/2014

\* cited by examiner

*Primary Examiner* — Thong Q Le
(74) *Attorney, Agent, or Firm* — Foley & Lardner LLP

(57) ABSTRACT

A method for controlling a resistive memory device is described. The resistive memory device including a memory cell provided between a first interconnection and a second interconnection crossing the first interconnection, and the memory cell transitions reversibly between a first resistance state and a second resistance state. The method includes detecting a first current flowing through a memory cell by applying a first voltage between the first interconnection and the second interconnection; comparing a value of the first current with a first criteria value; and determining whether the memory cell is in the first resistance state or the second resistance state. The method further includes comparing the value of the first current with a second criteria value greater than the first criteria value; and setting a first flag for the memory cell when the value of the first current is greater than the second criteria value.

19 Claims, 9 Drawing Sheets

METHOD FOR CONTROLLING RESISTIVE MEMORY DEVICE

CROSS-REFERENCE TO RELATED APPLICATIONS

This application is based upon and claims the benefit of priority from Japanese Patent Application No. 2016-255009, filed on Dec. 28, 2016; the entire contents of which are incorporated herein by reference.

FIELD

Embodiments relate generally to a method for controlling a resistive memory device.

BACKGROUND

A memory cell in a resistive memory device deteriorates due to repetitive data writing and data erasing, thereby finally leading to a short-circuit failure. As a result, in some cases, malfunction of another memory cell, which is positioned in the vicinity of the memory cell that results in the short-circuit failure, occurs. Furthermore, when excessive current flows through the memory cell in the short failure, the memory cell is damaged, and this also influences another memory cell that is positioned in the vicinity.

DETAILED DESCRIPTION

Figure 1:
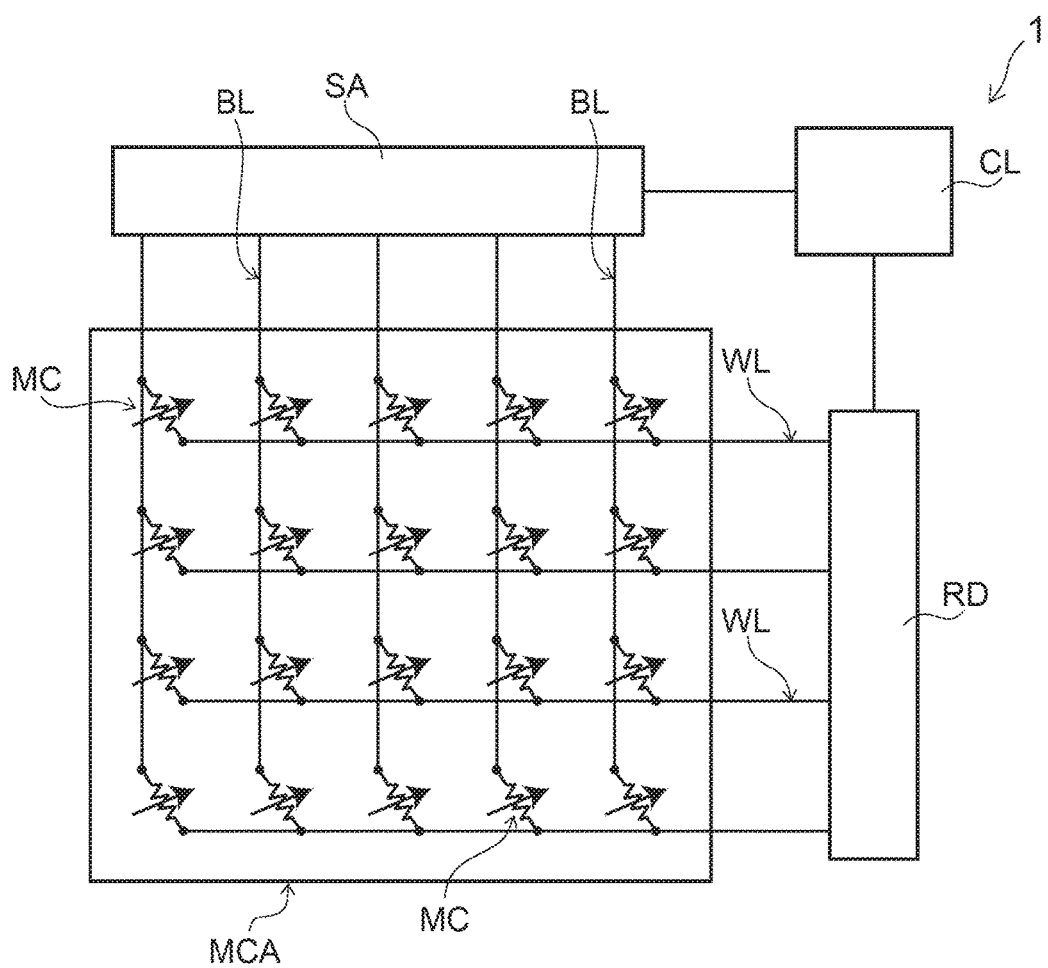
FIG. 1 is a schematic view showing a resistive memory device according to an embodiment.

A method for controlling a resistive memory device is described according to one embodiment. The resistive memory device includes a memory cell provided between a first interconnection and a second interconnection crossing the first interconnection, and the memory cell transitions reversibly between a first resistance state and a second resistance state that is less resistive than the first resistance state. The method includes detecting a first current flowing through the memory cell by applying a first voltage between the first interconnection and the second interconnection; comparing a value of the first current with a first criteria value; and determining whether the memory cell is in the first resistance state or the second resistance state. The method further includes comparing the value of the first current with a second criteria value greater than the first criteria value; and setting a first flag for the memory cell when the value of the first current is greater than the second criteria value.

Various embodiments will be described hereinafter with reference to the accompanying drawings. Similar portions in the drawing are marked with like reference numerals, a detailed description is omitted appropriately, and different portions will be described. The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

FIG. 1 is a schematic view showing a resistive memory device 1 according to an embodiment. The resistive memory device 1, for example, includes memory cell array MCA that includes a plurality of memory cells MC, a sense amplifier SA, a row decoder RD, and a controller CL. The sense amplifier SA, the row decoder RD, and the controller CL are disposed in the vicinity of the memory cell array MCA. The embodiment is not limited to this example, and for example, an integrated peripheral circuit that has each function of the sense amplifier SA, the row decoder RD, and the controller CL may be provided.

The plurality of memory cells MC that are disposed in the memory cell array MCA is electrically connected to the sense amplifier SA through a plurality of bit lines BL. Furthermore, the plurality of memory cells MC are electrically connected to a row decoder RD through a plurality of word lines WL. The memory cells MC, for example, are disposed in a matrix form, and the plurality of bit lines BL each extend in the column direction. Furthermore, the plurality of word lines WL each extend in the row direction. The memory cells MC are disposed at points at which the bit lines BL and the word lines WL cross, respectively. The plurality of memory cells MC that are disposed side by side in the column direction are electrically connected to one bit line BL. On the other hand, the plurality of memory cells MC are disposed side by side in the row direction are electrically connected to one word line.

The memory cell MC includes a resistance change layer that is provided between the word line WL and the bit line BL. The resistance change layer, for example, includes a metal oxide or a semiconductor material. Furthermore, the resistance change layer may have a structure in which a plurality of metal oxides are stacked on top of each other, and may have a structure in which the metal oxide and the semiconductor material are stacked on top of each other.

Figure 2:
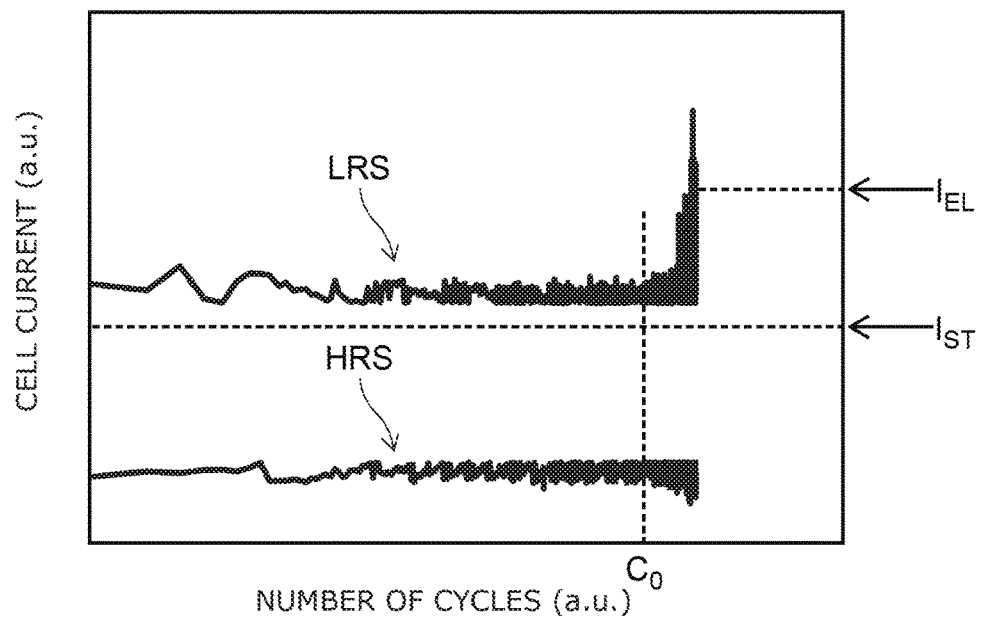
FIG. 2 is a graph showing a current characteristic of the memory cell according to the embodiment.

FIG. 2 is a graph showing a current characteristic of the memory cell MC according to the embodiment. The horizontal axis represents the number of cycles of data writing and erasing in the memory cell MC. The vertical axis represents a cell current $I_{CELL}$ that flows via the memory cell MC in a case where a read voltage $V_{READ}$ is applied between the bit line BL and the word line WL. Illustrated in FIG. 2 are a current $I_{CELL}$ in a case where the memory cell MC is in a low resistance state LRS and a cell current $I_{CELL}$ in a case where the memory cell MC is in a high resistance state HRS.

As illustrated in FIG. 2, there appears a cycle at which the cell current $I_{CELL}$ in the low resistance state starts to increase when the number of cycles exceeds $C_0$ and at which the cell current $I_{CELL}$ increases rapidly when the number of cycles is further increased. Moreover, when the data writing and erasing continue and the number of cycles increases, the memory cell MC is in a short-circuit state. Various memory cells, of which resistance-variable materials are different from each other, have this characteristic in common.

In contrast, for example, when data is prohibited from being written to the memory cell MC, in which the cell current $I_{CELL}$ in the low resistance state LRS increases rapidly, deterioration of the memory cell MC is suppressed, and thus a short-circuit failure can be prevented. That is, the cycles of the data writing and erasing at which a high voltage and current stress are applied to the memory cell MC are stopped and thus the deterioration leading to a short circuit can be suppressed. Specifically, a life determination criterion $I_{EL}$ is set for the cell current $I_{CELL}$ in the low resistance state LRS, and the data writing to the memory cell MC in which the cell current $I_{CELL}$ is higher than the life determination criteria $I_{EL}$ is prohibited. At this point, the life determination criteria $I_{EL}$ is set to be at a value that is higher than a data determination criteria $I_{ST}$ for determining in which one of the low resistance state LRS and the high resistance state HRS the memory cell MC is.

Figure 3:
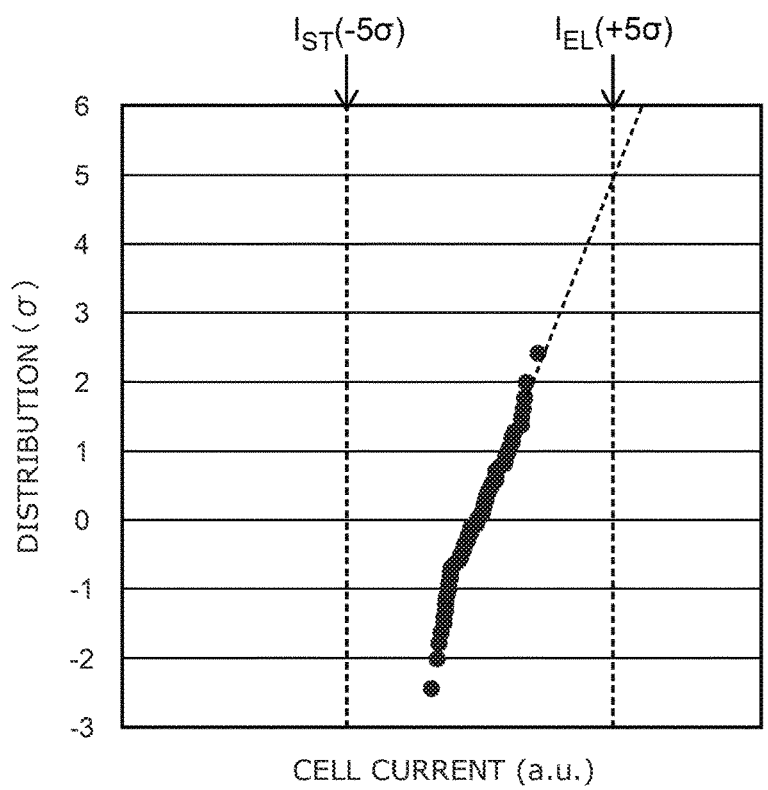
FIG. 3 is a graph showing a current distribution of the memory cell according to the embodiment.

FIG. 3 is a graph showing a current distribution of the memory cell MC according to the embodiment. The horizontal axis represents the cell current $I_{CELL}$ in the low resistance state LRS and the vertical axis represents a distribution a of the cell current $I_{CELL}$. Furthermore, a plot in FIG. 3 indicates an initial distribution of the cell current $I_{CELL}$.

For example, the data determination criteria $I_{ST}$ is set to be a current value of minus 5σ and the life determination criteria $I_{EL}$ is set to be at a current value of plus 5σ. Accordingly, an erroneous determination of data that is stored in the memory cell MC is prevented, and the short-circuit failure of the memory cell MC can be prevented. In this case, the life determination criterion $I_{EL}$ is approximately three times the data determination criteria $I_{ST}$. The life determination criteria $I_{EL}$, for example, may be three or more times the data determination criteria $I_{ST}$.

Figure 4:
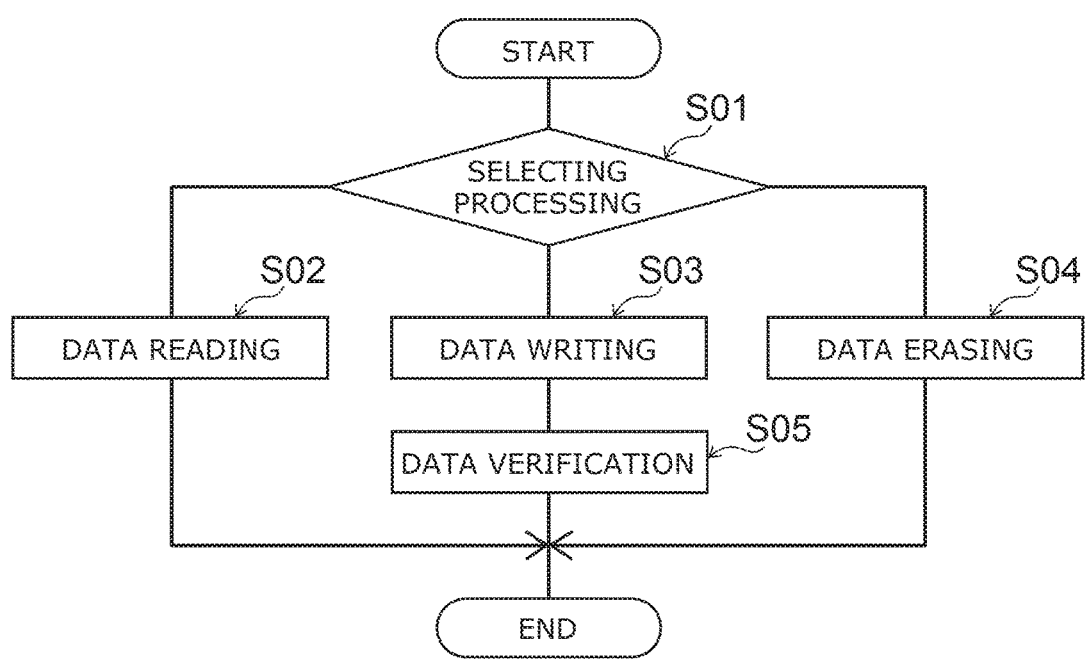
FIG. 4 is a flowchart showing an access pattern to the memory cell array according to the embodiment.

Next, a method of controlling the resistive memory device 1 is described with reference to FIGS. 1 and 4 to 6. FIG. 4 is a flowchart showing an access pattern to the memory cell array MCA according to the embodiment. In the specification, for example, it is assumed that an operation of causing the memory cell MC to transition from the high resistance state HRS to the low resistance state LRS is data writing and an operation of causing the memory cell MC to transition from the low resistance state LRS to the high resistance state HRS is data erasing.

The controller CL selects processing that is performed on the memory cell array MCA according to a command that is input from the outside (S01). For example, the controller CL selects any of the data reading (S02), the data writing (S03) and the data erasing (S04).

For example, the controller CL selects the data reading processing (S02), and reads data that is designated with a command. Specifically, the controller CL extracts a memory area in which data is stored, sends a control command to each of the sense amplifier SA and the row decoder RD, and causes the read voltage $V_{READ}$ to be applied to the memory cell MC in the area in which the data is stored, via the bit line BL and the word line WL. The sense amplifier SA detects the cell current $I_{CELL}$ that flows through the memory cell MC, performs a comparison with the data determination criteria $I_{ST}$, and specifies data that is stored in the memory cell MC. Accordingly, the data that is stored in the memory cell MC is read, and for example, is retained in a temporary storage area of the sense amplifier SA. Moreover, the controller CL causes the sense amplifier SA to output the data to the outside, and ends the data reading processing.

In the following description, for simplicity, the controller CL is described as controlling the memory cell MC directly, but it goes without saying that as described above, the memory cell MC is caused to operate with the sense amplifier SA and the row decoder RD being involved.

The controller CL selects data writing processing (S03), and writes data that is designated. Moreover, the controller CL reads data that is written and verifies whether or not the read data is the designated data (S05). So-called Verify Read is performed.

Furthermore, the controller CL selects data erasing processing (S04), and erases data that is designated. Specifically, an erasing voltage $V_{RESET}$ is applied between the bit line BL and the word line WL that are connected to the memory cell MC in which the designated data is stored, and causes the memory cell MC to transition from the low resistance state LRS to the high resistance state HRS.

Figure 5:
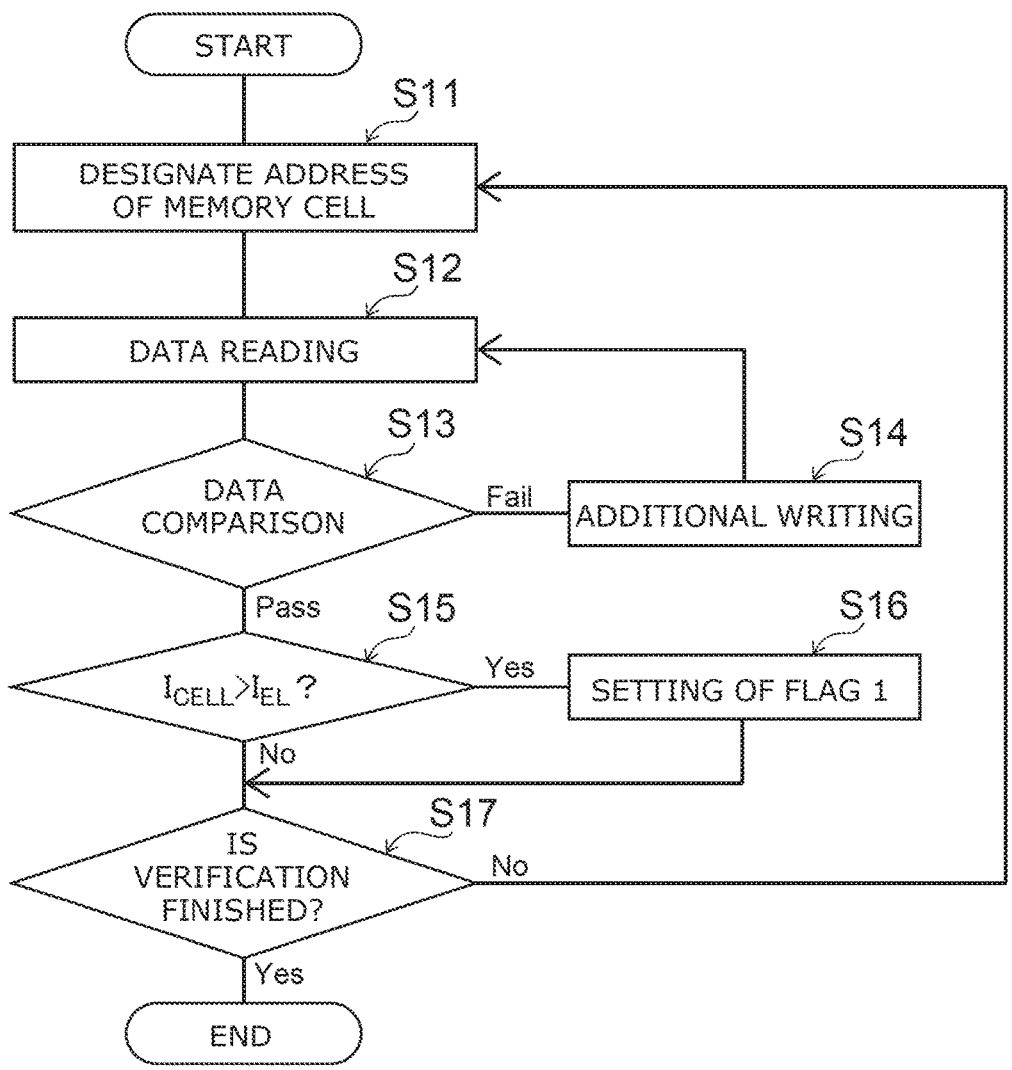
FIG. 5 is a flowchart showing a procedure for verifying writing data according to the embodiment.

FIG. 5 is a flowchart showing a procedure for verifying writing data according to the embodiment. FIG. 5 is a flowchart showing processing that is performed in the data verification processing (S05) that is illustrated in FIG. 4.

The controller CL designates an address of the memory cell MC to which the data is written (S11). Subsequently, the read voltage $V_{READ}$ is applied to the memory cell MC, and the data that is stored is read (S12).

The controller CL compares the read data with the written data (S13). In a case where the read data is not consistent with the written data, the controller CL performs additional writing (S14). Subsequently, data that is additionally written is read (S12), and the read data is compared with the written data (S13).

In a case where the read data is consistent with the written data, the controller CL compares the cell current $I_{CELL}$ that corresponds to the read data with the life determination criteria $I_{EL}$ (S15). In a case where the cell current $I_{CELL}$ is higher than the life determination criteria $I_{EL}$, the controller CL sets a flag 1 for the memory cell MC (S16). Specifically, the controller CL causes the address of the memory cell MC to be stored in a prescribed area. The controller CL can verify the presence or absence of the flag 1 by reading the address of the memory cell MC that is retained in such an area.

In a case where the cell current $I_{CELL}$ is the same as or lower than the life determination criteria $I_{EL}$, or after the flag 1 is set, the controller CL determines the presence or absence of the memory cell MC that has to be continuously verified (S17). If the memory cell MC that has to be continuously verified does not remain, the data verification processing is caused to be ended. Furthermore, if the memory cell MC that has to be continuously verified is present, the address there of is designated (S11), and the processing is continued.

Figure 6:
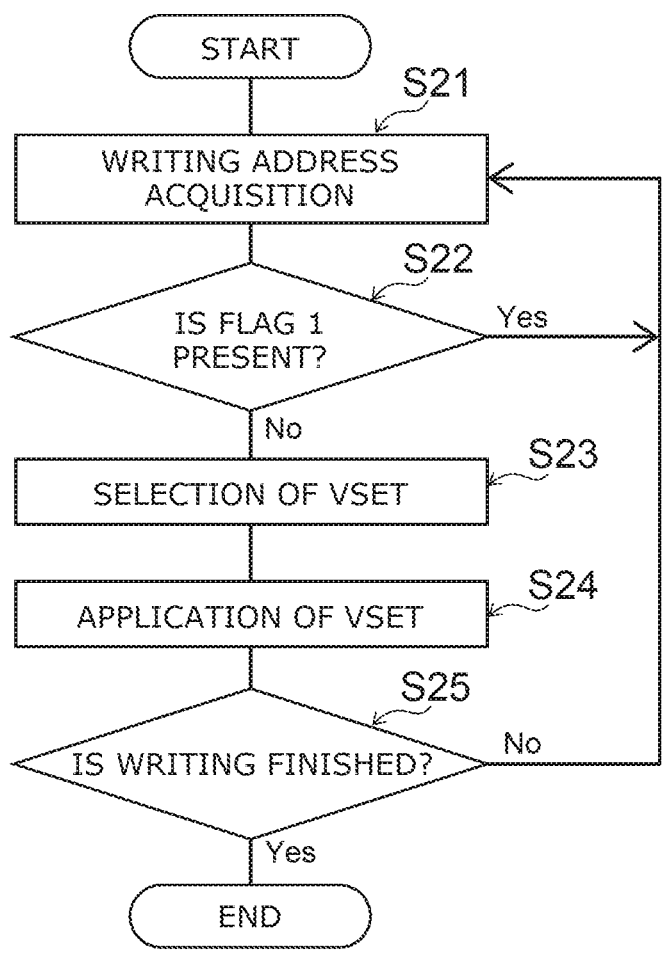
FIG. 6 is a flowchart showing a data writing procedure according to the embodiment.

FIG. 6 is a flowchart showing a data writing procedure according to the embodiment. FIG. 6 is a flowchart showing the processing that is performed in the data writing (S03) in FIG. 4.

The controller CL acquires the address of the memory cell MC to which the designated data is written (S21). The memory cell MC, to which data is actually written, is not in use or erased, and is in the high resistance state HRS.

The controller CL determines whether or not the flag 1 is set for the memory cell MC to which data is written (S22). In a case where the flag 1 is set for the memory cell MC, the controller CL stops the data writing, and acquires a next address of the memory cell MC.

In a case where the flag 1 is not set for the memory cell MC to which data is written, the controller CL selects a write voltage $V_{SET}$ in accordance with the data (S23). For example, in a case where data that has to be written corresponds to the low resistance state LRS, the write voltage $V_{SET}$, which is higher than a voltage (hereinafter referred to as a first transition voltage $V_{CVHL}$) necessary for causing the memory cell MC to transition from the high resistance state to the low resistance state, is selected. Furthermore, if the data that has to be written corresponds to the high resistance state HRS, a voltage, for example, 0V, at which the memory cell MC stays at the high resistance state HRS, is selected as the write voltage $V_{SET}$.

In the specification, a relationship between high and low voltages is described with the voltage, which is applied to the memory cell MC, being regarded as a positive voltage. Therefore, in a case where both of the first transition voltage $V_{CVHL}$ and the write voltage $V_{SET}$ that are applied to the memory cell MC are negative voltages, it has to be understood that the relationship between high and low voltages in terms of absolute values of these voltages is described. That is, an absolute value of the write voltage $V_{SET}$ that is applied to the bit line BL and the word line WL is greater than an absolute value of the first transition voltage $V_{CVHL}$.

Subsequently, the controller CL applies the write voltage $V_{SET}$ between the bit line BL and the word line WL that are connected to the memory cell MC to which data is to be written, and writes the data to the memory cell MC (S24). That is, the resistance state of the memory cell MC is caused to transition or to remain as is, in a manner that corresponds to the data that is to be written.

The controller CL verifies the finishing of the writing (S25). In a case where the data that has to be written remains, the controller CL acquires a next address of the memory cell MC (S21) and continues the processing. In a case where the writings of pieces of designated data are all finished, the controller CL ends the data writing processing.

As described above, in the embodiment, when the cell current $I_{CELL}$ which flows in a case where the read voltage $V_{READ}$ is applied to the memory cell MC in the low resistance state LRS exceeds the life determination criteria $I_n$, the flag 1 is set. Then, a determination is made that the data writing to the memory cell MC for which the flag 1 is set is not performed. That is, the data writing to the memory cell MC in which the cell current $I_{CELL}$ exceeds the life determination criteria $I_{EL}$ is prohibited, and the cycles of the data writing and erasing are caused to be stopped. Accordingly, in the memory cell MC in which the cell current $I_{CELL}$ increases rapidly, the data writing and erasing that is accompanied by current and voltage stress can be caused to be stopped, and progress in deterioration, which leads to the short-circuit failure, can be suppressed.

Figure 7:
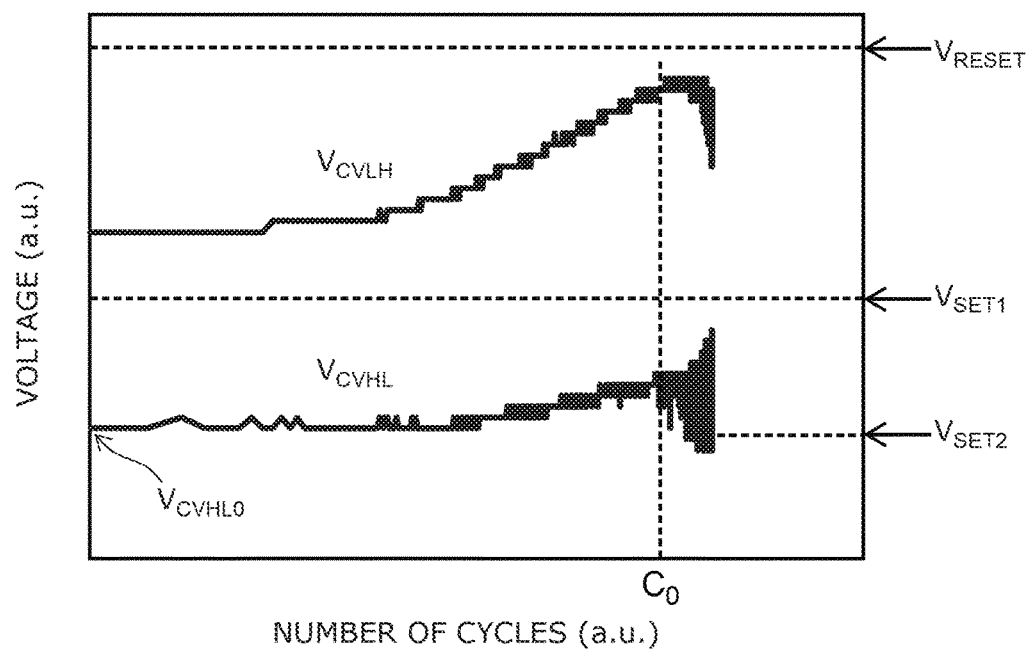
FIG. 7 is a graph showing data write voltage and erasing voltages of the memory cell according to the embodiment.
Figure 8:
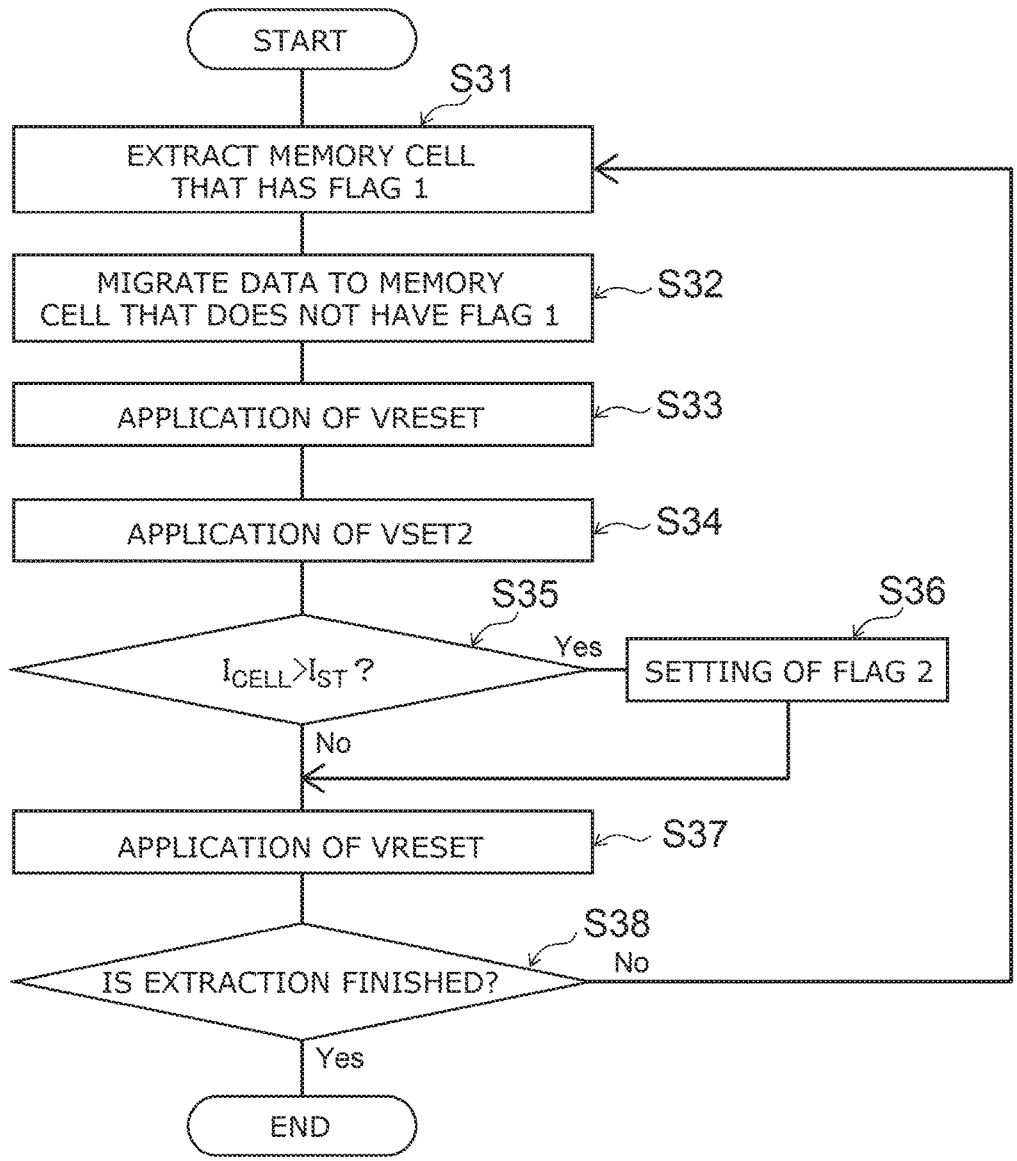
FIG. 8 is a flowchart showing a procedure for prohibiting writing according to the variation of the embodiment.
Figure 9:
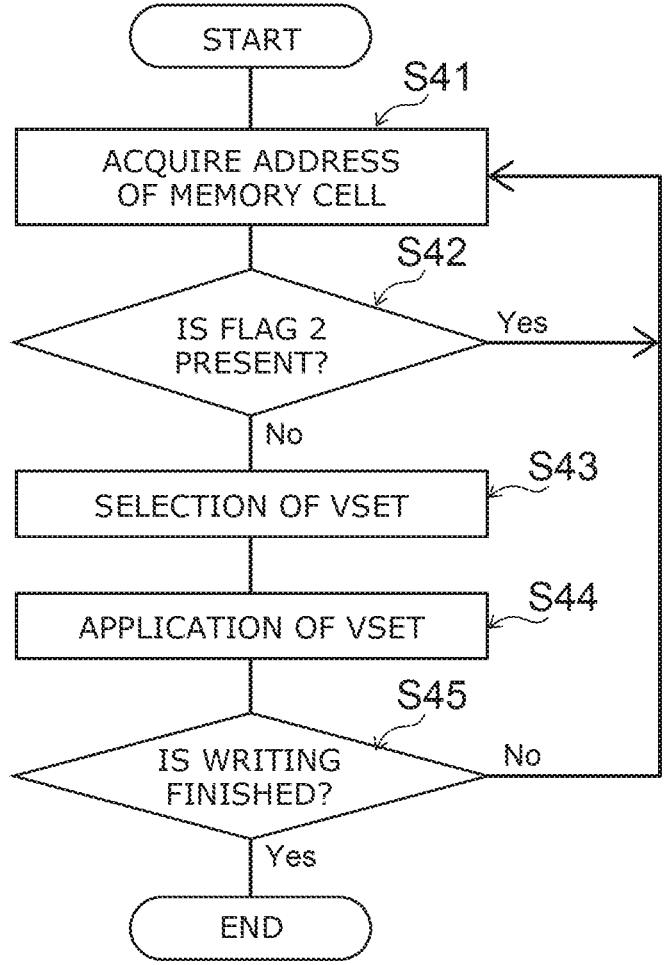
FIG. 9 is a flowchart showing a procedure for data writing according to the variation of the embodiment.
Figure 10:
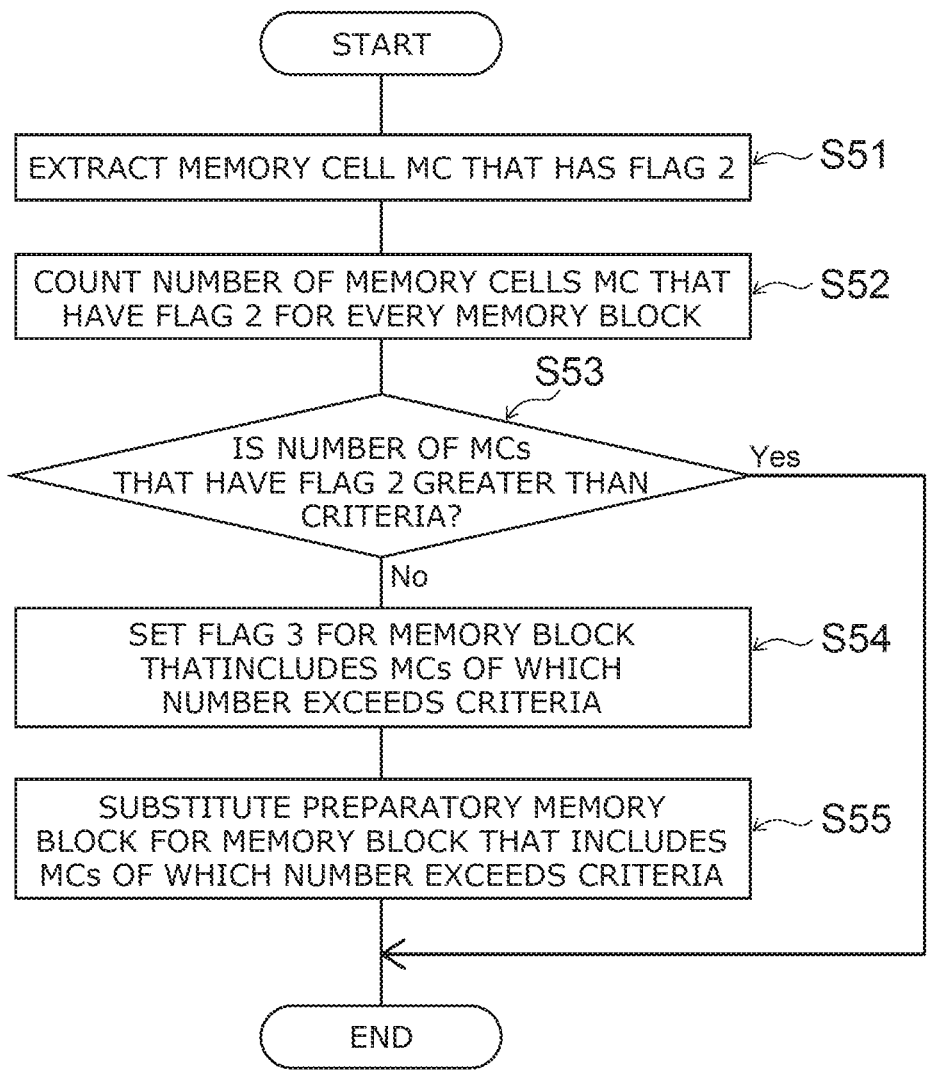
FIG. 10 is a flowchart showing a procedure for replacing the memory cell according to the variation of the embodiment.

Next, a method of controlling the resistive memory device according to a variation of the embodiment is described with reference to FIG. 1 and FIG. 7 to FIG. 10. FIG. 7 is a graph showing data write voltage and erasing voltages of the memory cell according to the embodiment. FIGS. 8 to 10 are flowcharts showing a control procedure according to the variation of the embodiment.

FIG. 7 is a graph illustrating the first transition voltage $V_{CVHL}$ and a second transition voltage $V_{CVLH}$ in the memory cell MC with respect to the number of cycles of the data writing and erasing. The horizontal axis represents the number of cycles and the vertical axis represents a voltage. The first transition voltage $V_{CVHL}$ is a voltage necessary for causing the memory cell MC to transition from the high resistance state to the low resistance state, and the second transition voltage $V_{CVLH}$ is a voltage necessary for causing the memory cell MC to transition from the low resistance state to the high resistance state. It is noted that typically, the first transition voltage $V_{CVHL}$ and the second transition voltage $V_{CVHL}$ are opposite in polarity, and voltages in FIG. 7 has to be interpreted as absolute values thereof.

As illustrated in FIG. 7, the first transition voltage $V_{CVHL}$ shows the tendency to increases gradually as the number of cycles increases. Then, the first transition voltage $V_{CVHL}$ starts to change at the number of cycles $C_0$ and a changing range thereof is enlarged as the number of cycles increases. Moreover, in some cases, the first transition voltage $V_{CVHL}$ is lower than an initial value $V_{CVHL0}$.

For example, based on these changes in the first transition voltage $V_{CVHL}$ and the second transition voltage $V_{CVLH}$, the erasing voltage $V_{RESET}$ and a write voltage $V_{SET1}$ are set. The erasing voltage $V_{RESET}$ has the same polarity as the second transition voltage $V_{CVLH}$, and is set to be at a value that is higher than an absolute value of the second transition voltage $V_{CVLH}$. The write voltage $V_{SET1}$ has the same polarity as the first transition voltage $V_{CVHL}$, and is set to be at a value that is higher than an absolute value of the first transition voltage $V_{CVHL}$. That is, the erasing voltage $V_{RESET}$ is opposite in polarity in the write voltage $V_{SET1}$.

Moreover, in this example, a write voltage $V_{SET2}$ is set. The write voltage $V_{SET2}$ has the same polarity as the write voltage $V_{SET1}$, and an absolute value thereof may be lower than an absolute value of the write voltage $V_{SET1}$. Moreover, the write voltage $V_{SET2}$ is set to be at a level within a changing range of the first transition voltage $V_{CVHL}$. The write voltage $V_{SET2}$ is favorably set to be at a level that is the same as an initial value $V_{CVHL0}$ of the first transition voltage $V_{CVHL}$, or to be at a level that is lower than the initial value $V_{CVHL0}$.

The first transition voltage $V_{CVHL}$ that is illustrated in FIG. 7 corresponds to an increase in the cell current $I_{CELL}$ in the low resistance state LRS. As illustrated in FIG. 2, the cell current $I_{CELL}$ starts to increase at a point in time at which the number of cycles exceeds $C_0$. Moreover, when the number of cycles further increases, the cell current $I_{CELL}$ increases rapidly. Correspondingly, the changing range of the first transition voltage $V_{CVHL}$ is enlarged. At the same time, a change in the second transition voltage $V_{CVLH}$ is reversed from increase to decrease. For example, it is considered that the deterioration in the memory cell MC in which the first transition voltage $V_{CVHL}$ falls below the initial value $V_{CVHL0}$ thereof progresses to a greater extent than other memory cells MC.

In this example, a test for the data writing using the write voltage $V_{SET2}$ is performed on the memory cell MC in which the cell current $I_{CELL}$ in the low resistance state LRS increases rapidly. Based on the result, memory cells MC in which the first transition voltage $V_{CVHL}$ is lower than the voltage $V_{SET2}$ is selected, and for example, writing to these memory cells MC are set to be prohibited. Accordingly, the short-circuit failure of the memory cell MC is prevented.

FIG. 8 is a flowchart showing a procedure for setting a flag 2 for the memory cell MC according to the variation of the embodiment. The flag 2 is set for a memory cell in which a transition voltage $V_{CVHL}$ is decreased among the memory cells MC for which the flag 1 is set. That is, a procedure for selecting a memory cell of which deterioration progresses among from the memory cells MC for which the flag 1 is set. A procedure that is illustrated in FIG. 8, for example, is executed after the data verification (S05) that is illustrated in FIG. 4, or during the idling time for which a command is not input from the outside to the controller CL. Furthermore, for the data verification (S05) in FIG. 4, the procedure that is illustrated in FIG. 5 is assumed to be executed.

The controller CL extracts the memory cell MC where the flag 1 is set and data is written (S31). Subsequently, the data that is stored in the extracted memory cell MC is migrated to another memory cell MC (S32). It does without saying that the memory cell that is a migration destination is a memory cell MC that is not in use, from which data is erased, and to which the flag 1 is not set.

The controller CL applies the erasing voltage $V_{RESET}$ between the bit line BL and the word line WL that are connected to the extracted memory cell MC, and causes the extracted memory cell to transition from the low resistance state LRS to the high resistance state HRS (S33).

The controller CL applies the write voltage $V_{SET2}$ of which the absolute value is smaller than a normal write voltage $V_{SET1}$, which is described above, between the bit line BL and the word line WL that are connected to the memory cell MC (S34). Subsequently, the controller CL applies the read voltage $V_{READ}$ between the same bit line BL and word line WL, and detects the cell current $I_{CELL}$ that flows through the bit line BL. Moreover, the controller CL compares the detected cell current $I_{CELL}$ with the data determination criteria $I_{ST}$ (S35).

In a case where the cell current $I_{CELL}$ is higher than the data determination criteria $I_{ST}$, the controller CL sets the flag 2 for the memory cell MC (S36). That is, it is determined that in the memory cell MC, the first transition voltage $V_{CVHL}$ is lowered below the write voltage $V_{SET2}$, and that the deterioration due to the cycles of the data writing and erasing progresses.

In a case where the cell current $I_{CELL}$ is lower than the data determination criteria $I_{ST}$, or after the flag 2 is set, the controller CL applies the erasing voltage $V_{RESET}$ between the bit line BL and the word line WL that are connected to the memory cell MC, and causes the memory cell MC to transition to the high resistance state HRS (S37).

The controller CL verifies the finishing of the extraction of the memory cell for which the flag 1 is set (S38). In a case where the memory cell MC that has to be extracted remains, the controller CL extracts a next memory cell MC (S31) and continues the processing. In a case where the extraction of the memory cell for which the flag 1 is set is finished, the controller CL causes the setting processing of the flag 2 to be ended.

With the procedure described above, the short-circuit failure of the memory cell MC can be prevented more efficiently, for example, by prohibiting the data writing to the memory cell MC for which the flag 2 is set. In this case, the flag 1 is provided in order to select the memory cell MC in which the cell current $I_{CELL}$ increases rapidly and limits a target for which the flag 2 is set.

Furthermore, in the procedure described above, Step S37 in which the memory cell MC is caused to transition to the high resistance state may be omitted. As illustrated in FIG. 2, in a case where the cell current $I_{CELL}$ in the low resistance state LRS increases rapidly, an increase in the cell current $I_{CELL}$ in the high resistance state HRS is not seen. Therefore, after the writing to the memory cell MC for which the flag 2 is set is prohibited, power consumption can be reduced by causing the transition to the high resistance state HRS. In such a case, Step S37 is favorably performed. On the other hand, in a case where an effect of reducing the power consumption due to the transition to the high resistance state HRS is small, improvement in processing speed due to omission of Step S37 may be selected.

FIG. 9 is a flowchart showing a data writing procedure according to the variation of the embodiment. In this example, a procedure for prohibiting the writing on the memory cell MC for which the flag 2 is set is illustrated. FIG. 9 is a flowchart showing the processing that is performed in the data writing (S03) in FIG. 4.

The controller CL acquires the address of the memory cell MC to which the designated data is written (S41). The memory cell MC, to which data is written, is a memory cell MC that is not in use, or from which data is erased, and is in the high resistance state HRS.

The controller CL determines whether or not the flag 2 is set for the memory cell MC at the acquired address (S42). In a case where the flag 2 is set for the memory cell MC, the controller CL acquires a next address (S41).

In a case where the flag 2 is not set for the memory cell MC to which data is to be written, the controller CL selects the write voltage $V_{SET}$ that corresponds to the data (S43). For example, in a state where data that has to be written corresponds to the low resistance state LRS, the write voltage $V_{SET1}$ is selected. Furthermore, in the state where the data that has to be written corresponds to the high resistance state HRS, the voltage, for example, 0V, at which the memory cell MC stays at the high resistance state HRS, is selected as the write voltage $V_{SET}$.

Subsequently, the controller CL applies the write voltage $V_{SET}$ between the word line WL and the bit line BL that are connected to the memory cell MC, and writes data (S44).

The controller CL verifies the finishing of the writing (S45). In the case where data that has to be written remains, the controller CL acquires a next address of the memory cell MC (S41), and continues the processing. In a case where the writings of pieces of designated data are all finished, the controller CL ends the data writing processing.

In this example, the data writing to the memory cell MC for which the flag 1 and the flag 2 are set is prohibited. On the other hand, the data writing to the memory cell MC for which only the flag 1 is set is continued.

The embodiment is not limited to the example described above. For example, in Step S42 that is illustrated in FIG. 9, it may be changed to a step of prohibiting the writing to the memory cell MC by determining that the flag 1 is set for the memory cell MC. Moreover, in the data reading processing (S02) and the data erasing processing (S04) that are illustrated in FIG. 4, a step of prohibiting the data reading and data erasing from and to the memory cell MC by determining that the flag 2 is set for the memory cell MC may be added. That is, access to the memory cell MC for which the flag 2 is set may be prohibited.

In the embodiment, the example is described in which a plurality of memory cells MC are individually accessed and the processing of each of the plurality of memory cells is performed. However, the embodiment is not necessarily limited to this, and the processing may be performed on every memory block that includes a plurality of memory cells MC.

FIG. 10 is a flowchart showing a procedure for replacing the memory cell MC according to the variation of the embodiment. In FIG. 10, substitution processing that is performed on every memory block is illustrated. The procedure that is illustrated in FIG. 10, for example, is performed during the idling time for which a command is not input from the outside to the controller CL.

The controller CL extracts the memory cell MC for which the flag 2 is set (S51). This processing, for example, is performed on all the memory cells MC that are included in the memory cell array MCA.

The controller CL counts the number of memory cells MC for which the flag 2 is set for every memory block (S52), and determines whether or not the number of memory cells MC is equal to or smaller than a criteria (S53). The memory block is a plurality of memory cells MC that are connected to one bit line BL.

In a case where the memory block that includes the plurality of memory cells MC of which the number exceeds the criteria, the controller CL sets a flag 3 for the block (S54).

Moreover, the controller CL substitutes a preparatory memory block for the memory block for which the flag 3 is set (S55). Specifically, data that is stored in the memory block for which the flag 3 is set is migrated to the preparatory memory block, and access to the memory block for which the flag 3 is set is set to be prohibited.

After the substitution for the memory block (S55), or in a case where the number of memory cells MC for which the flag 2 is set in all memory blocks is lower than the criteria, the controller CL causes the substitution processing to be ended.

In this example, in each memory block, in a case where the number of memory cells MC, the writing to which is prohibited, exceeds a permission number (the criteria), access to the memory block is set to be prohibited, and the processing that substitutes the preparatory memory block is performed. Moreover, after the substitution for the memory block (S55), processing (not illustrated) that causes the memory cell MC, which is included in the memory block for which the flag 3 is set, to transition to the high resistance state, may be performed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method for controlling a resistive memory device, the method comprising:
    applying a first voltage between a first interconnection and a second interconnection and detecting a first current flowing through a memory cell, the memory cell being provided between the first interconnection and the second interconnection crossing the first interconnection, and transitioning reversibly between a first resistance state and a second resistance state that is less resistive than the first resistance state;
    determining whether the memory cell is in the first resistance state or the second resistance state by comparing a value of the first current with a first criteria value;
    comparing the value of the first current with a second criteria value greater than the first criteria value;
    setting a first flag for the memory cell, when the value of the first current is greater than the second criteria value;
    determining presence or absence of the first flag; and
    writing data in a memory cell for which the first flag is not set.

2. The method according to claim 1, wherein
    the value of the first current is compared with the second criteria value, when the memory cell is in the second resistance state.

3. The method according to claim 1, wherein
    the second criteria value is approximately three times or more the first criteria value.

4. The method according to claim 1, wherein
    data is stored in the memory cell for which the first flag is set, and
    the method further comprises transferring to another memory cell, the data stored in the memory cell for which the first flag is set.

5. The method according to claim 1, further comprising:
    making transition in the memory cell from the first resistance state to the second resistance state by applying a second voltage between the first interconnection and the second interconnection;
    applying a third voltage between the first interconnection and the second interconnection after the memory cell is changed from the second resistance state to the first resistance state, the third voltage having a polarity same as a polarity of the second voltage, and being lower than an absolute value of the second voltage;
    applying the first voltage between the first interconnection and the second interconnection after applying the third voltage, and detecting a second current flowing through the memory cell;
    comparing a value of the second current with the first criteria value; and
    setting a second flag for the memory cell when the value of the second current is higher than the first criteria value.

6. The method according to claim 5, wherein
    the memory cell for which the second flag is set is changed to the first resistance state.

7. The method according to claim 6, further comprising:
    changing the memory cell from the second resistance state to the first resistance state by applying a fourth voltage having a higher absolute value than an absolute value of the second voltage.

8. The method according to claim 5, further comprising:
    determining presence or absence of the second flag; and
    writing first data in a memory cell for which the second flag is not set.

9. The method according to claim 8, further comprising:
    reading the first data out from the memory cell for which the second flag is not set.

10. The method according to claim 5, wherein
    the resistive memory device has a plurality of memory blocks, each memory block including a plurality of memory cells,
    the number of the second flags is counted for every memory block, and
    a third flag is set for a memory block in which the number of the second flags is greater than a prescribed criteria.

11. The method according to claim 10, wherein
    data stored in the memory block for which the third flag is set is transferred to another memory block.

12. The method according to claim 10, further comprising:
    determining presence or absence of the third flag;
    writing data in a memory cell in a memory block for which the third flag is not set; and
    reading the data out from the memory cell in the memory block for which the third flag is not set.

13. The method according to claim 12, further comprising:
changing memory cells to the first resistance state in the memory block for which the third flag is set.

14. A method for controlling a memory device including a plurality of memory cells provided between first interconnection and second interconnection crossing the first interconnection, and transitioning reversibly between a first resistance state and a second resistance state that is less resistive than the first resistance state, the method comprising:
detecting a first current flowing through a memory cell by applying a first voltage between the first interconnection and the second interconnection;
determining whether the memory cell is in the first resistance state or the second resistance state by comparing a value of the first current with a first criteria value;
identifying a first memory cell in the plurality of memory cells by comparing a value of the first current with a second criteria value greater than the first criteria value, the first memory cell having the value of the first current greater than the second criteria value;
setting a first flag for the first memory cell;
determining presence or absence of the first flag; and
writing data in a memory cell for which the first flag is not set.

15. The method according to claim 14, further comprising:
changing the memory cell from the first resistance state to the second resistance state by applying a second voltage between the first interconnection and the second interconnection;
applying a third voltage between the first interconnection and the second interconnection after the memory cell is changed from the second resistance state to the first resistance state, the third voltage having a polarity same as a polarity of the second voltage, and being lower than an absolute value of the second voltage;
detecting a second current flowing through the memory cell by applying the first voltage between the first interconnection and the second interconnection after the third voltage is applied; and
identifying a second memory cell in the plurality of memory cells by comparing a value of the second current with the first criteria value, the second memory cell having the value of the second current greater than the first criteria value.

16. The method according to claim 14, further comprising:
determining whether a memory cell accessed in the plurality of memory cells is the first memory cell or not; and
writing data in a memory cell other than the first memory cell.

17. The method according to claim 15, further comprising:
determining whether a memory cell accessed in the plurality of memory cells is the second memory cell or not, and
writing data in a memory cell other than the second memory cell.

18. The method according to claim 17, further comprising:
reading the data out from the memory cell other than the second memory cell.

19. The method according to claim 17, further comprising:
changing the second memory cell to the first resistance state.

* * * * *